United States Patent [19]

Freeman et al.

[11] Patent Number: 4,558,983

[45] Date of Patent: Dec. 17, 1985

[54] AUTOMATIC BOARD HANDLING MECHANISM

[75] Inventors: Gary T. Freeman, Beverly; Richard B. Maxner, Danvers; Thomas F. Nash, Stoneham, all of Mass.

[73] Assignee: USM Corporation, Farmington, Conn.

[21] Appl. No.: 544,734

[22] Filed: Oct. 24, 1983

[51] Int. Cl.⁴ .............................................. B65G 1/00
[52] U.S. Cl. ...................................... 414/331; 29/741; 29/759; 198/574; 414/280
[58] Field of Search ............... 414/331, 277, 278, 285, 414/280–282, 659, 661; 29/739–741, 759; 198/435, 574, 339

[56] References Cited

U.S. PATENT DOCUMENTS

| | | | |
|---|---|---|---|
| 2,536,756 | 1/1951 | Lopez | 198/435 X |
| 4,063,347 | 12/1977 | Woodman, Jr. | 29/703 X |
| 4,129,229 | 12/1978 | Brown | 198/435 X |
| 4,144,960 | 3/1979 | Scourtes | 198/339 |
| 4,274,529 | 6/1981 | Mori et al. | 198/470 X |
| 4,373,846 | 2/1983 | Charbonnet | 414/331 |
| 4,450,400 | 5/1984 | Gwyn | 414/281 X |
| 4,470,741 | 9/1984 | Bossler et al. | 414/280 |
| 4,474,525 | 10/1984 | Murao | 414/331 |

Primary Examiner—Joseph E. Valenza
Assistant Examiner—David A. Bucci
Attorney, Agent, or Firm—Alan N. McCartney

[57] ABSTRACT

A mechanism for automatically loading and unloading printed circuit boards from a electrical component insertion machine comprising an elevator for vertically moving and positioning conveyors adjacent a board storage, one of the conveyors being adapted to extract a board from the storage and convey the board to the insertion machine and the other conveyor being adapted to receive the assembled board from the insertion machine and insert the assembled board back into the storage. A conveyor is mounted on the table of the insertion machine and a bridge conveyor transfers the board from the table conveyor to the vertically movable conveyors to transport the boards onto and off from the insertion machine table.

6 Claims, 10 Drawing Figures

AUTOMATIC BOARD HANDLING MECHANISM

BACKGROUND OF THE INVENTION

1. Field of the Invention

A mechanism for automatically extracting print circuit boards from a supply source, mounting the boards on a table for assembling electrical components to the boards, removing the assembled boards from the table and inserting the assembled boards into the supply source.

2. Statement as to Prior Art

As a result of the development of machines for automatically inserting electrical components into printed circuit boards, it has become desirable to provide mechanisms to automatically supply the boards to the component insertion machines. This will facilitate increasing board assembly rates and minimize board handling with less operator supervision. Devices of this type are illustrated in U.S. Pat. Nos. 3,722,062, 3,808,662, 4,209,898, 4,274,529 and 4,283,847. These mechanisms all operate on the principle of transferring the board from one end of a component insertion machine to the other by means of a continuous conveyor of some type upon which the board is carried. This requires each blank board to be removed from one storage magazine, positioned at one end of the machine, and transferred to a separate receiving magazine at the other end of the machine after the component insertion has taken place.

SUMMARY OF THE INVENTION

A mechanism for automatically extracting a printed circuit board from a storage means and loading the board on the table of a component assembly machine, and unloading and inserting the board back into the storage means after the board assembly operation has been completed. The storage means comprises a magazine having a plurality of racks or trays containing the boards and the board loading and unloading mechanism is adapted to return each assembled board back into the rack or tray of the magazine from which it was extracted. In this fashon, such an automatic board loader and unloader can be positioned at each end of a double headed assembly machine and each head of the machine can assemble its own set of boards. The boards being assembled by each head can be similar or dissimilar in component assembly requirements, thus lending versitility to the component assembly machine.

It is also an object of this invention to provide an automatic printed circuit board handling apparatus that can extract the boards from a storage means, move the boards vertically to a position to be horizontally loaded onto the assembly table of a component insertion machine. The assembled boards can then be horizontally removed from the assembly table and moved vertically to be horizontally conveyed back into the storage means.

It is a further object of this invention to provide in an automatic printed circuit board handling apparatus, a pair of conveyors mounted for vertical movement, each conveyor being adapted to horizontially convey a board. One of the conveyors being adapted to extract a board from a storage means and the other conveyor being adapted to insert an assembled board into the storage means.

It is a further object of this invention to provide in a printed circuit board handling apparatus, a pair of horizontally disposed, vertically aligned conveyors mounted for vertical movement to remove the boards from a stationary magazine and move the boards horizontally onto a component assembly station and obtain the assembled board from the assembly station and reinsert the board into the storage means. There is a separate conveyor on the assembly station to receive the unassembled board from one such conveyor and transfer the assembled board onto the other of such conveyors. A separate bridge conveyor is positioned between the vertically aligned conveyors and the conveyor on the assembly station, so that the boards can be moved to and from the conveyor on the assembly station. The bridge conveyor is movable vertically into and out of driving engagement with the conveyor on the assembly station.

All of the above operations are software controlled so that the board extracting, board loading, component insertion, and board unloading, and board insertion occurrs in proper timed sequence.

DISCRIPTION OF THE PREFERRED EMBODIMENT

Figure 2:
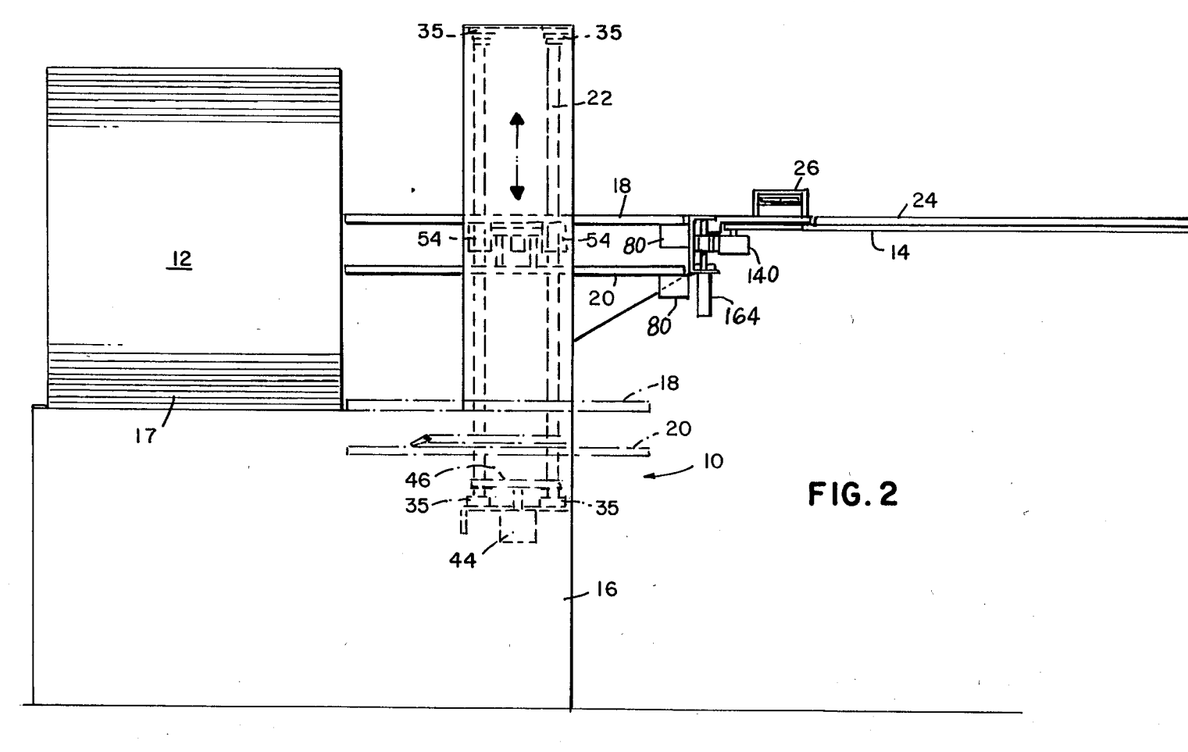
FIG. 2 is a side elevation of the mechanism positioned adjacent the table of a component assembly machine.

The automatic board loader and unloader 10 obtains a printed circuit board (B) from a storage means such as magazine 12 and presents the board to the table 14 (FIGS. 2 and 5) of a component insertion machine (not shown) which places electronic components into the board. The insertion machine has an assembly station on an X-Y table and an insertion head that receives components from a supply source and inserts them into the board. A component insertion machine of the type referred to is illustrated in U.S. Pat. No. 4,063,347. The machine may have a single insertion head or a double insertion head of the type illustrated in pending U.S. patent application Ser. No. 670,663 filed Nov. 13, 1984, which is a continuation of U.S. patent application Ser. No. 340,474, filed Jan. 18, 1982 now abandoned. After completion of the component insertion operation, the assembled board is removed from the table and reinserted back into the magazine at the location from which it was removed. This will become more apparent hereinafter.

The magazine 12 is positioned on a support housing 16 which carries the automatic board loader and unloader mechanism 10. The support housing 16 is adapted to be positioned adjacent the table of a component insertion machine. The mechanism 10 can be positioned at either the right hand or left hand side of the machine and is adaptable to feed the boards to a double headed component insertion machine, as previously mentioned.

The mechanism 10 generally comprises a pair of horizontal conveyors 18 and 20 mounted for vertical movement on an elevator 22 carried in the support housing 16. The conveyor 18 extracts a printed circuit board from a rack or tray 17 of the magazine and presents the board to a conveyor 24 on the machine table 14. After the board has been assembled, the conveyor 24 presents the assembled board to the conveyor 20 which inserts the board back into the rack or tray of the magazine from which it was obtained. Conveyor 18 then removes the next board in sequence to be assembled from the magazine where upon the process will be repeated. During this board loading and unloading sequence, a bridge conveyor 26 will connect either of the conveyors 18 and 20, as necessary, to the conveyor 24 for loading or unloading the board from the assembly table. This entire operation is program controlled so that each portion of the operation properly occurs in the desired predetermined sequence.

This novel manner of handling printed curcuit boards also permits a double headed component assembly machine to be used as illustrated in U.S. patent application Ser. No. 670,663 filed Nov. 13, 1984, which is a continuation of U.S. patent application No. 340,474, filed Jan. 18, 1982 now abandoned, with the automatic board loaders supplying boards from opposite sides of the machine. In this fashion, different types of boards can be assembled with a single assembly machine. Further, with dual headed assembly machines of this type positioned parallel to one another with an intermediate operator station, a single operator can control four different boards at one time.

Figure 1:
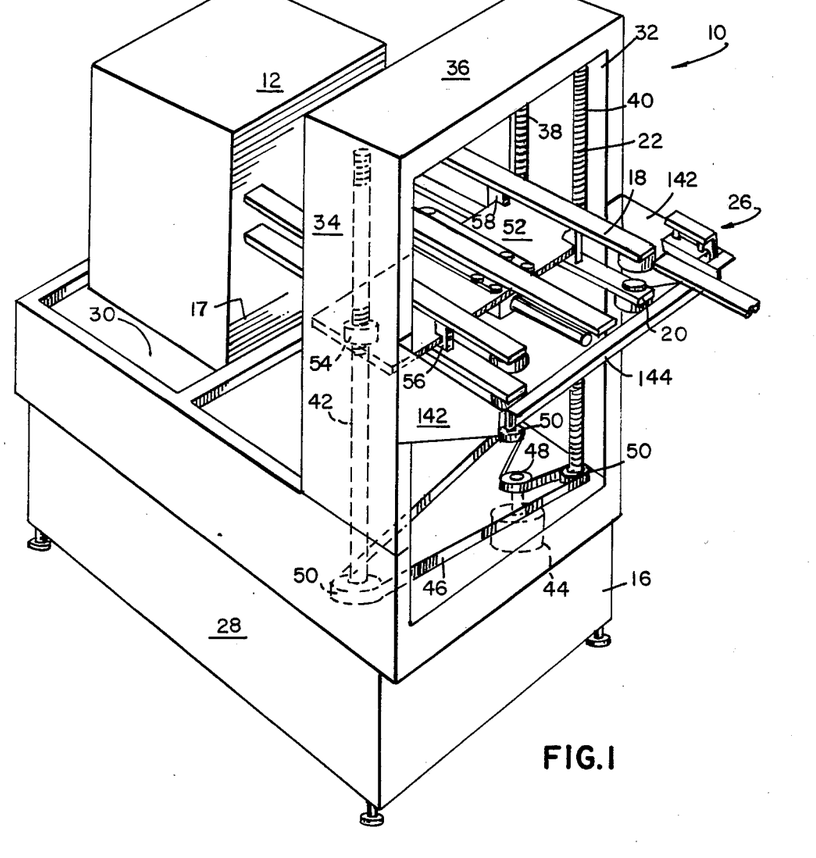
FIG. 1 is a diagramatic perspective view of the board handling mechanism of this invention.

Attention is now directed to FIG. 1 wherein the support housing 16, is illustrated as having a base support 28 with a platform 30 for supporting the magazine 12 adjacent the board loader and unloader mechanism 10. The base support 28 has opposed upstanding side walls 32 and 34 interconnected by a top 36. Rotatably mounted at 35 in the base support 28 and top 36 adjacent side wall 32 are a pair of drive screws 38,40. An additional drive screw 42 is rotatably mounted in the base support 28 and top 36 adjacent side wall 34. The screws 38,40 and 42 of the elevator 22 are driven by a motor 44. A belt 46 connects the drive pulley 48 of the motor 44 to the pulleys 50 on each of the drive screws 38, 40 and 42. A support plate 52 is carried on bearing collars 54 threaded on the drive screws 38, 40, 42. The plate 52 carries conveyors 18 and 20 on support brackets 56 and 58 as shown in FIG. 1. The motor 44 is reversible to rotate the drive screws 38, 40 and 42 in either direction to raise and lower the support plate 52 and conveyor 18 and 20. In this fashion, the conveyors can be raised and lowered to extract and insert the boards into any tray or rack 17 of the magazine.

Figure 4:
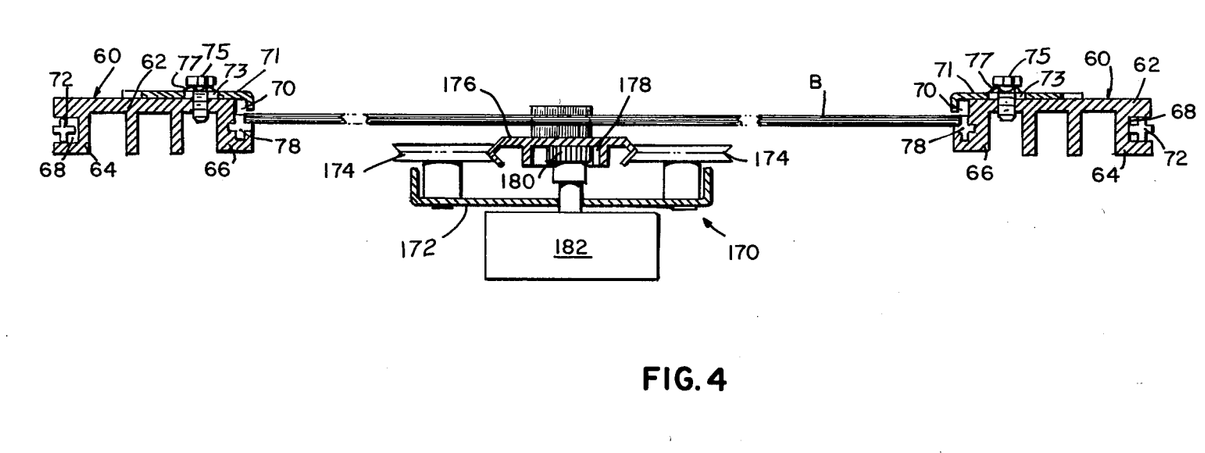
FIG. 4 is an enlarged elevational view of the conveyor and board extracting means.

Each of the conveyors 18 and 20 comprise tracks 60 carried on support brackets 56 and 58. The tracks 60 each comprise a U-shaped support 62 with legs 64,66 having recesses 68,70 for receipt of conveyor belts 72. The recesses 70 in legs 66 have the same configuration as the belt to maintain belt alignment in the track. The belts 72 pass around pulleys 74,76 mounted at each end of the tracks 60. The belts 72 are cross shaped and have one upper leg 78 that suppprt to board as illustrated in FIG. 4. Guide plates 71 are positioned on the top of the tracks to assist in keeping the board on the upper leg 78 of the belt. The plates 71 are retained by fasteners 75 passing through slots 73 in the plates. Washers 77 bias the plates 71 downward and permit the plates 71 to be moved away from the board to remove the board from the belts 72. Motors 80 are mounted at one end of the tracks 60 and engage drive pulleys 74 to drive each of the belts 72 of the upper and lower conveyors 18 and 20. The table conveyor 24 has the same configuration as conveyors 18 and 20 with pulleys 82 and 84 at each end carrying a drive belt 83 on a support 85, similar to track 60 and belt arrangement 72 (see FIG. 6).

Figure 6:
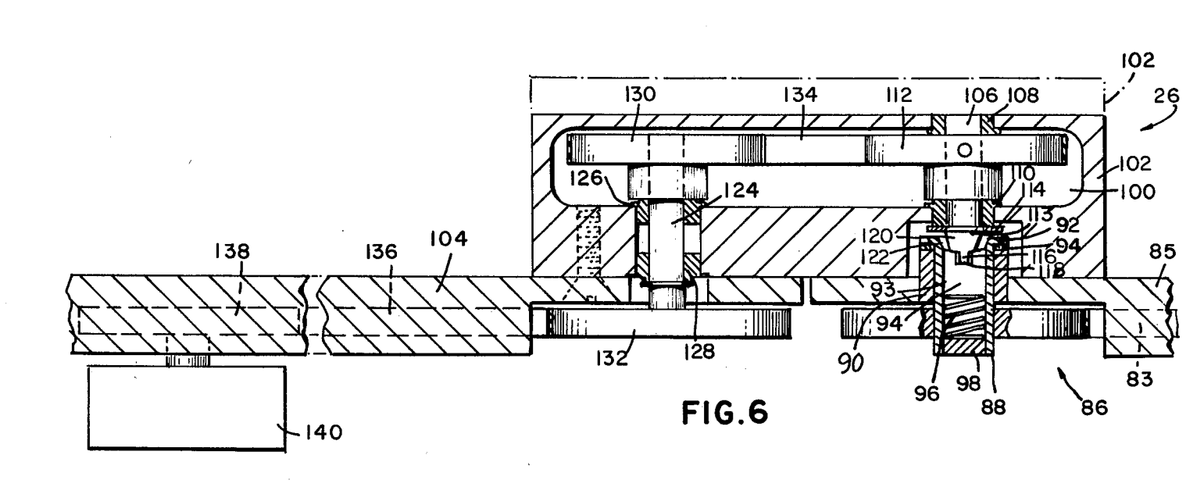
FIG. 6 is a sectional view of the bridge conveyor.
Figure 7:
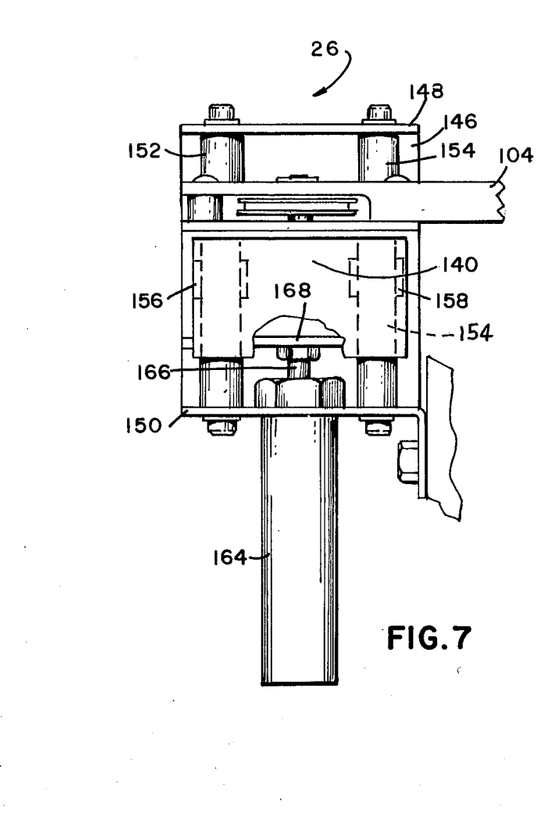
FIG. 7 is a front view of the bridge conveyor support mechanism.
Figure 8:
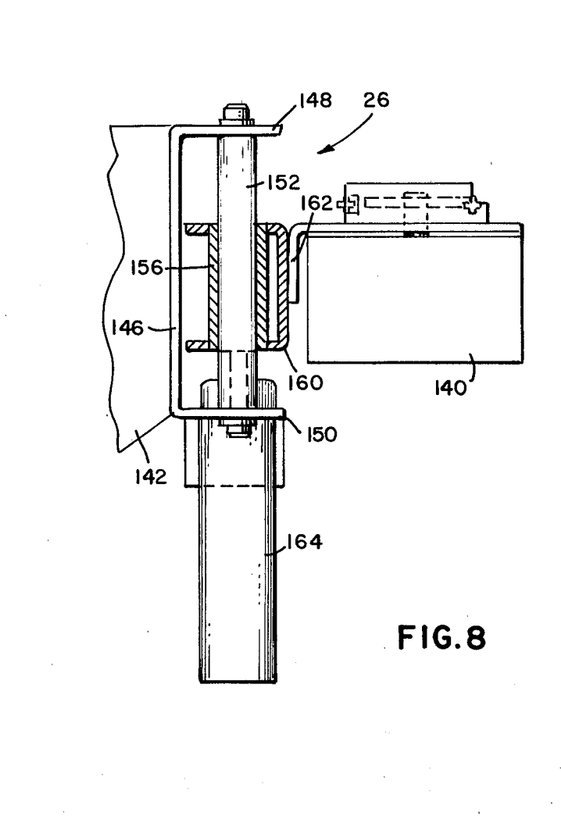
FIG. 8 is a side view of the bridge conveyor support mechanism.

Attention is now directed to FIGS. 6 to 8 which illustrate the bridge conveyors 26 which interconnect the conveyors 18 and 20 to conveyor 24 to transport the boards to and from the assembly table. Each of the supports 85 carry a coupling 86 which rotatably mounts the pulleys to the supports 85. The couplings 86 comprise a sleeve 88 secured within the pulley and journaled in a bearing 90 secured to the support 85. The sleeve 88 is retained in the bearing 90 by a snap ring 92. The internal opening 93 of sleeve 88 is square and receives a plug 94 biased outwardly by a spring 96 positioned between the plug 94 and end plug 98 in the sleeve 88.

The drive portion 100 of the bridge conveyor 26 is carried in a housing 102 supported on plates 104. The housing 102 has a pin 106 carried in bearings 108 and 110. A pulley 112 is mounted on pin 106. The pin 106 has a shoulder 113 receiving a lock washer 114 to lock the pin 106 in bearings 108,110. The end of pin 106 has a projection 116 adapted to be received in the slot 118 in plug 94 to provide a driving interengagement between the pin 106 and plug 94. The housing 102 is adapted to be raised and lowered to engage and disengage the pin 106 from plug 94 to connect the drive to pulley 82 and thus conveyor 24. The end 120 of pin 106 is conical and plug 94 has a cone shape opening 122 to aid in centering the pin 106 and plug 94 for engagement.

The housing 102 also carries a pulley shaft 124 in bearings 126,128. Pulleys 130 and 132 are carried on shaft 124. The pulley 130 is connected by a belt 134 to pulley 112 and pulley 132 is connected by a belt 136 to a pulley 138 on a motor 140 carried on support 104. The belts 134 and 136 have the same configuration as belts 72 as illustrated in FIG. 8.

The above described bridge conveyor is mounted for vertical movement to drive engagement and disengagement with the table conveyor. A support bracket 142 is caried on each of the side walls 32 and 34, as illustrated in FIG. 1. The brackets 142 are interconnected by a cross support 144. The brackets 142 carry U-shaped supports 146, the legs 148,150 of which, carry vertical rods 152,154 on which bearings 156,158 are mounted. The bearings 156,158 carry a U-shaped bracket 160 attached to the support 162 mounted on plates 104 (see FIG. 8). Cylinders 164 are mounted on legs 150 and have a cylinder rod 166 attached to the leg 168 of bracket 160.

The drive engaged position of the bridge conveyor 26 is illustrated in FIG. 6 wherein the projection 116 is engaged in the plug 94. Energizing motor 140 will drive pullyes 138,132,130 and 112 which will drive pulley 82 through coupling 86 and thus drive the table conveyor 24. The motor 140 is reversible so that the table conveyor 24 can be driven in either direction.

To disengage the bridge conveyor 26 and thus the drive to the table conveyor 24, the cylinder 164 is activated causing the cylinder rod 166 to move bracket 160 up rods 152,154, and raise the plate 104 and housing 102 to disengage the drive coupling 86.

Figure 5:
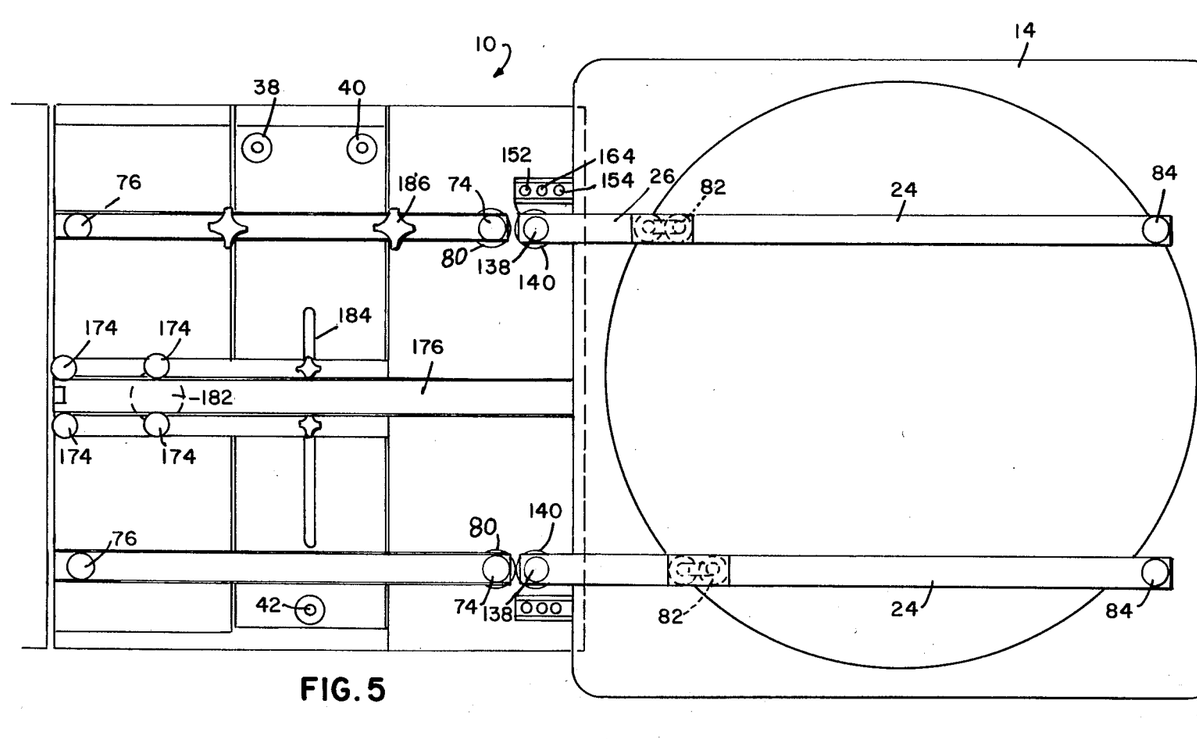
FIG. 5 is a plan view of the mechanism illustrating the upper extracting conveyor.

As the drive motor 44 positions the conveyors 18 and 20 at the desired location with respect to the magazine 12, a board extraction mechanism 170 is then activated. (see FIGS. 1,4,9 and 10). A support plate 172 is carried on plate 52 and extends between the tracks of the conveyor 18. The plate 172 carries V-grooved spindles 174, between which an extracting plate 176 is mounted for movement toward and away from the magazine. A rack 178 is mounted on the extracting plate 176 and engages the pinion 180 mounted on motor 182 carried on plate 172. The motor 182 is reversible to move the extacting plate 176 into and out-off the magazine in between the magazine trays. The connection 184 between support plate 172 and plate 52 is a pin and slot arrangement as illustrated in FIG. 5 so that the extracting mechanism 170 can be centered with respect to the tracks of conveyor 18. Further, the mounting of one of the conveyors 18 to the plate 52 is adjustable at 186 so that the conveyors 18 can be moved toward and away from one other to accommodate boards having different diameters.

Figure 9:
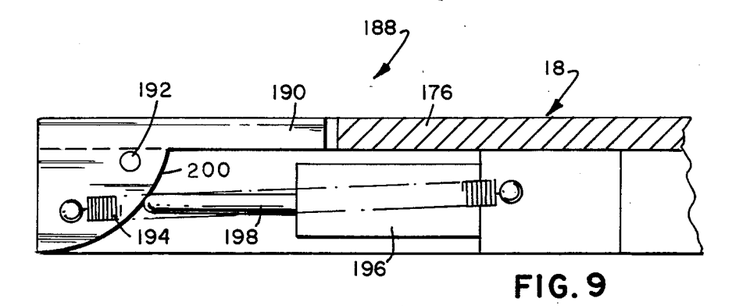
FIG. 9 is a view of the ltch mechanism for the board extractor.
Figure 10:
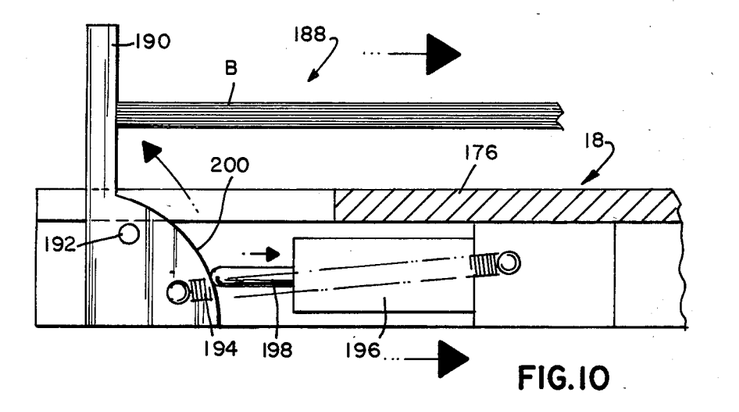
FIG. 10 is a view similar to FIG. 9 illustrating the latch mechanism in the raised position.

Attention is now directed to FIGS. 9 and 10 which illustrate the latch mechanism 188 mounted on the end of the extracting plate 176. The latch mechanism 188 comprises an arm 190 pivoted to plate 176 at 192. A spring 194 extends between arm 190 and the plate 176 to normally bias the arm 190 to an upright position as illustrated in FIG. 10. A cylinder 196 is carried to the plate 176 and has a rod 198 acting against the cam surface 200 of the arm 190. The outward movement of rod 198 will pivot the arm 190 against the bias of spring 194 to pivot the arm 190 downwardly to a position flush with the surface of the plate 176.

To retrieve a board from the magazine and place the board on the conveyor 18, the plate 176 is moved into the magazine between the boards being held in the magazine trays. At this time, the latch mechanism 188 is in the retracted position shown in FIG. 9. When the plate 176 is fully extended into the magazine, the cylinder retracts rod 198 to permit the spring 194 to pivot the arm 190 to the upright position to grab the back of the board as illustrated in FIG. 10. A reversal of motor drive 182 will pull the board onto conveyor 18. The vertical elevator 22 then places the conveyor 18 in line with the bridge and table conveyors (see FIG. 1). The cylinder 164 (See FIGS. 7 and 8) is then activated to lower the plate 104 and housing 102 to engage coupling 86. The motor 140 can then drive bridge conveyor 26 and table conveyor 24 to move the board onto the assembly station. At this time, the bridge conveyor is raised to disconnect the coupling 86 and drive to the table conveyor so that the board is stationary during the component insertion sequence.

Figure 3:
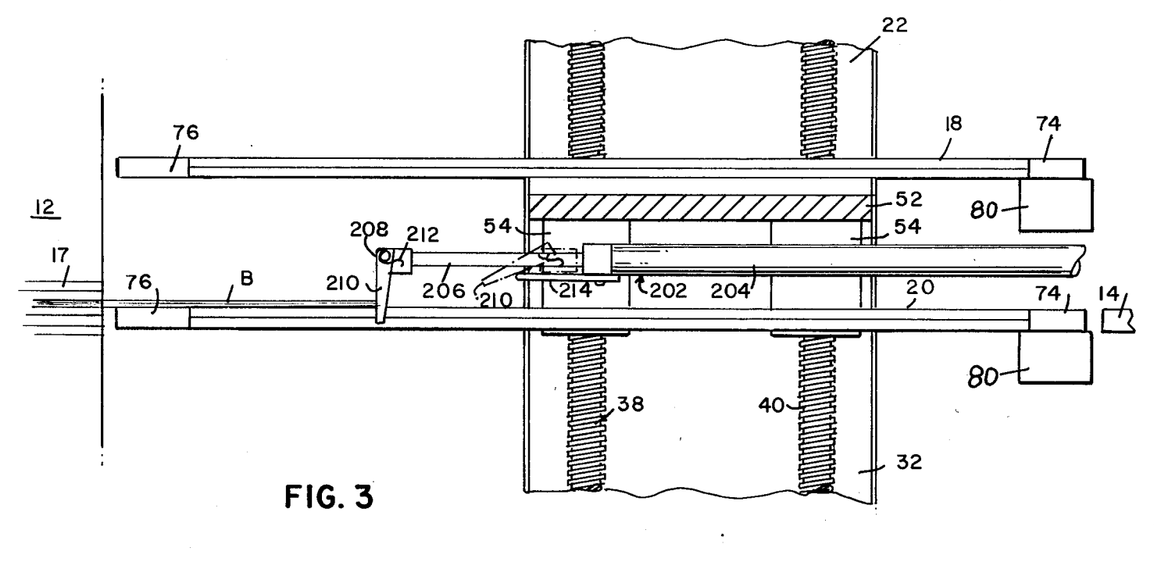
FIG. 3 is an enlarged elevational view of the elevator and conveyor means of the mechanism.

After the board is assembled, the bridge conveyor 26 is lowered and the motor 140 reversed to transport the assembled board onto conveyor 20, which has been raised to be aligned with the table. The elevator 22 then positions conveyor 20 adjacent the magazine tray from which the board was originally removed. When the board reaches the end of conveyor 20, a board insertion mechanism 202 inserts the board back into the magazine tray (see FIG. 3).

The board insertion mechanism 202 (see FIG. 3) comprises cylinder 204 carried on plate 52. The cylinder rod 206 carries a latch 208 having a pusher 210 downwardly biased by spring 212. When the cylinder 204 retracts the rod 206, the pusher 210 rests against a plate 214 fixed to cylinder 204. The pusher 210 is then in a raised position as illustrated in phantom lines FIG. 3 permitting the board to be moved down conveyor 20 past the pusher 210. When the rear edge of the board passes the pusher 210, the cylinder 204 will extend rod 206. The pusher 210 will be released from plate 214 and extend downwardly to abut the edge of the board. Further extension of the cylinder rod 206 will push the board off conveyor 20 into the rack in the magazine.

While the assembled board is being returned to the magazine in the manner decribed above, because of the spacing between the conveyors 18 and 20, the board extraction mechanism 170 can reach into the magazine in the manner described and be pulling an unassembled board onto conveyor 18. The conveyors 18 and 20 can then be positioned by elevator 22 so that an unassembled board can be loaded onto the table.

The cyclic operation of the bord handling mechanism is as follows: The extracting conveyor 18 removes a board from the magazine 12 and the eleavtor moves the conveyors to a position where the conveyor 18 is aligned with the table and the board is transported onto the table. The conveyor 18 then is vertically displaced to collect another board from the magazine and then vertically displaced so that conveyor 20 is aligned with the table to receive the assembled board. The assembled board is then transported onto conveyor 20 and the conveyors are vertically displaced to align conveyor 18 with the table at which time the unassembled board on conveyor 18 is transported onto the assembly table. The conveyors 18 and 20 are then vertically displaced so that the assembled board on conveyor 20 is inserted back into the magazine and conveyor 18 extracts an unassembled board from the magazine. The sequence is then repeated with the conveyor 18 loading the board onto the table and becoming reloaded again at the magazine. In this manner, the board extracting cycle of conveyor 18 overlaps the unload and board insertion cycle of conveyor 20 so that there is an unassembled board available for loading onto the table.

Thus, conveyor 18 extracts a board from the magazine and loads the table. The conveyor 18 then extracts another board from the magazine and both conveyors move so the assembled board is unloaded onto conveyor 20. Conveyor 18 then loads the table and both conveyors move to insert the assembled board from conveyor 20 into the magazine and extract a board from the magazine onto conveyor 18. Conveyor 18 then loads the table and returns to the magazine to extract another board. Both conveyors again move to a position for conveyor 20 to receive an assembled board from the table. In this fashion, maximum use is made of the board extracting, loading, unloading and insertion back into the magazine to expedite the component insertion operation.

We claim:

1. A mechanism for automatically loading and unloading printed circuit boards from a table of an electrical component insertion machine, comprising;
   a. a support housing;
   b. conveyor means mounted on an elevator carried in said housing, said conveyor means being movable vertically by said elevator to and from a position adjacent the machine table to load and unload the boards from the table;

c. a conveyor mounted on the table for receipt of the boards from the conveyor means and transfer of the boards back onto the conveyor;

d. a bridge conveyor positioned between said conveyor means and said table conveyor to transfer the boards to and from the conveyor means and said table conveyor;

e. said bridge conveyor having a drive coupling adapted to be connected to the table conveyor to drive the table conveyor to transfer the boards to and from the table; and f. said bridge conveyor being mounted on said support housing for vertical movement into and out of driving engagement with said table conveyor.

2. A mechanism for extracting printed circuit boards from a storage means, loading such boards onto an assembly table of a component insertion machine, removing an assembled board from the assembly table and inserting the assembled board back into the storage means the mechanism comprising:

a. means for extracting the boards from the storage means and conveying the boards onto the assembly table and for conveying the boards off the table and inserting the boards back into the strorage means;

b. an elevator for supporting said means for vertical movement from a position in operative relation to the storage means to a position in operative relation with the assembly table;

c. said means for extracting the board includes a first conveyor means for extracting the board from the storage means and loading the board onto the assembly table and a second conveyor means for unloading the assembled board from the assembly table and inserting the assembled board into the storage means;

d. drive means for said first conveyor means and said second conveyor means to operate said first and said second conveyor means in cyclic relation to automatically load the boards on the assembly table and remove the assembled boards from the assembly table; and e. a table conveyor mounted on the assembly table and a bridge conveyor movable vertically into and out of driving engagement with said table conveyor to transport the boards to and from said table.

3. The mechanism of claim 2 wherein said elevator positions said means to enable said means to insert the assembled board back into the storage means at the location in the storage means from which the board was extracted.

4. The mechanism of claim 2 wherein said first conveyor means includes a plate member insertable into and out of the stroage means and including means to abut the side edge of a board to pull the board from the storage means.

5. The mechanism of claim 2 wherein said second conveyor means includes means to contact the side edge of a board to push the board into the storage means.

6. A mechanism for automatically loading and unloading a printed circuit board from an assembly table of an electrical component inserting machine, comprising:

a. a support housing adapted to be positioned adjacent the assembly table;

b. an elevator mounted in the support housing;

c. a pair of conveyors mounted on said elevator for vertical movement with respect to the assembly table;

d. said conveyors each having means for horizontally transporting the board;

e. a bridge conveyor for coacting with said pair of conveyors to transport the board to and from the assembly table;

f. a transport means on the assembly table to receive the board from said brige conveyor and move the board to an assembly station on the table; and g. said bridge conveyor being vertically positioned into and out of driving engagement with said transport means.

* * * * *